United States Patent
Hikita et al.

(10) Patent No.: US 6,714,099 B2
(45) Date of Patent: Mar. 30, 2004

(54) RADIO FREQUENCY FILTER, RADIO FREQUENCY CIRCUIT, ANTENNA DUPLEXER AND RADIO TERMINAL

(75) Inventors: Mitsutaka Hikita, Kokubunji (JP); Nobuhiko Shibagaki, Kokubunji (JP); Naoki Matsuura, Mizusawa (JP); Kazuyuki Yokoyama, Mizusawa (JP); Shigeki Matsuda, Mizusawa (JP)

(73) Assignee: Hitachi Media Electronics Co., Ltd., Mizusawa (JP)

( * ) Notice: Subject to any disclaimer, the term of this patent is extended or adjusted under 35 U.S.C. 154(b) by 71 days.

(21) Appl. No.: 10/105,446

(22) Filed: Mar. 26, 2002

(65) Prior Publication Data

US 2002/0140520 A1 Oct. 3, 2002

(30) Foreign Application Priority Data

Mar. 30, 2001 (JP) ........................ 2001-101003
Feb. 1, 2002 (JP) ........................ 2002-025775

(51) Int. Cl.[7] .............. H03H 9/54; H03H 9/64; H03H 9/70; H03H 9/72
(52) U.S. Cl. .................. 333/133; 333/189; 333/193
(58) Field of Search ................ 333/133, 186–196

(56) References Cited

U.S. PATENT DOCUMENTS

| | | | | | |
|---|---|---|---|---|---|
| 5,422,615 A | * | 6/1995 | Shibagaki et al. | .......... | 333/246 |
| 5,471,722 A | * | 12/1995 | Yatsuda | ...................... | 29/25.35 |
| 5,515,015 A | * | 5/1996 | Nakata | ........................ | 333/132 |
| 5,789,845 A | * | 8/1998 | Wadaka et al. | ............. | 310/334 |
| 6,115,592 A | * | 9/2000 | Ueda et al. | ................. | 455/307 |
| 6,222,426 B1 | * | 4/2001 | Komazaki et al. | .......... | 333/133 |
| 6,373,350 B1 | * | 4/2002 | Fujita | ......................... | 333/133 |
| 6,489,860 B1 | * | 12/2002 | Ohashi | ....................... | 333/133 |

FOREIGN PATENT DOCUMENTS

| | | | |
|---|---|---|---|
| JP | 9-181567 | * | 7/1997 |
| JP | 10-242888 | * | 9/1998 |

* cited by examiner

*Primary Examiner*—Barbara Summons
(74) *Attorney, Agent, or Firm*—Crowell & Moring LLP

(57) ABSTRACT

A radio frequency filter that can be miniaturized is provided. The radio frequency filter has a ladder-type resonator filter, a first terminal, a second terminal, a serial capacitance, a parallel capacitance, a serial inductance, and a parallel inductance. In the ladder-type resonator filter, a plurality of first surface acoustic wave resonators or first film bulk acoustic resonators are connected in a ladder circuit configuration. The serial inductance and the parallel capacitance are connected between the ladder-type resonator filter and the first terminal. The serial capacitance and the parallel inductance are connected between the ladder-type resonator filter and the second terminal.

18 Claims, 11 Drawing Sheets

RADIO FREQUENCY FILTER, RADIO FREQUENCY CIRCUIT, ANTENNA DUPLEXER AND RADIO TERMINAL

FIELD OF THE INVENTION

The present invention relates to a radio frequency filter using a surface acoustic wave (hereinafter referred to as "SAW") resonator filter or a film bulk acoustic resonator (hereinafter referred to as "FBAR") filter suitable for a mobile radio terminal, a radio frequency circuit having such a radio frequency filter, an antenna duplexer using such a radio frequency circuit, and a radio terminal using such an antenna duplexer.

BACKGROUND ART

Conventionally, mobile radio terminals have used a heterodyne system. According to the heterodyne system, a received radio frequency (RF) signal is once converted into a comparatively high intermediate frequency, and then demodulated through an amplifier, a filter, and so on. In recent years, in dual band terminals, code division multiple access (CDMA) terminals, or the like, a direct conversion demodulation system or a low intermediate frequency demodulation system has been investigated for the purpose of simplification of RF circuitry.

Generally, in the direct conversion demodulation system or in the low intermediate frequency demodulation system, a differential low noise amplifier (hereinafter referred to as "LNA") or a differential mixer (hereinafter referred to as "Mix.") is used. In the background art, however, the connection between the RF filter or the antenna duplexer and the LNA or the Mix, has not been taken into consideration sufficiently. For example, the reception-system output of the antenna duplexer is single-ended because the output is extracted directly from a built-in filter. Accordingly, mismatching may occur between the antenna duplexer and the differential LNA or the differential Mix.

To eliminate such mismatching, it is considered to be the most general procedure to use an unbalanced-to-balanced converter constituted by distributed parameter lines as shown in FIG. 1.

In FIG. 1, the reference numeral 41 represents an unbalanced input terminal; 42, a balanced output terminal; and 43, a quarter-wavelength coupler constituted by a quarter-wavelength microstrip line.

However, since this converter has quarter-wavelength lines as its basic configuration, the volume of the converter is large so as to cause an obstacle to miniaturization of the RF circuit as a whole.

Unbalanced-to balanced convert is described in the document "Product Hotline Magazine Vol. 34, January 2000, pp.17–22".

SUMMARY OF THE INVENTION

It is an object of the present invention to solve the problem that might arise from the connection between a radio frequency filter or an antenna duplexer and a differential LNA or a differential Mix. introduced in a direct conversion demodulation system or a low intermediate frequency demodulation system that will be adopted widely in the near future, that is, the problem that the volume is so large that the RF circuit as a whole becomes large in size.

It is another object of the present invention to provide a system different from the unbalanced-to-balanced converter in order to satisfy the specification in GSM Regulation 05.05 that is a regulation of GSM.

Generally, in an antenna duplexer for a mobile radio terminal, dielectric resonators connected in cascade have been used as a reception-system filter or a transmission-system filter. In the present invention, a ladder-type SAW resonator filter in which a plurality of SAW resonators are connected in a ladder circuit configuration in an SAW chip or a ladder-type FBAR filter in which a plurality of FBARs are connected in a ladder circuit configuration in a chip is used particularly in a reception-system filter so as to micro-miniaturize a radio frequency filter.

Next, a first reception-system output terminal of the antenna duplexer is extracted from an output terminal of the ladder-type SAW resonator filter or the ladder-type FBAR filter (collectively referred to as "ladder-type resonator filter") through a serial inductance and a parallel capacitance with respect to the ground. A second reception-system output terminal of the antenna duplexer is extracted from the same output terminal of the ladder-type resonator filter through a serial capacitance and a parallel inductance with respect to the ground. In addition, the values of the serial inductance, the parallel inductance, the serial capacitance and the parallel capacitance are determined to be specified values on the basis of the input impedance of a differential LNA or a differential Mix. in a subsequent stage and the output impedance of the ladder-type resonator filter.

As a result, the specification is designed to satisfy the above-mentioned GSM regulation. Thus, in the pass band frequency of the ladder-type resonator filter, the amplitude deviation between output signals from the first and second terminals can be fit to a value not larger than ±1 dB, and the phase deviation between the output signals from the first and second terminals can be fit to a value not larger than ±10° with respect to 180°. Accordingly, the antenna duplexer is allowed to connect in series with the differential LNA or the differential Mix. in the subsequent stage. Further, this configuration is also established on a mere ladder-type resonator filter alone in the same manner.

DESCRIPTION OF THE PREFERRED EMBODIMENTS

Figure 1:
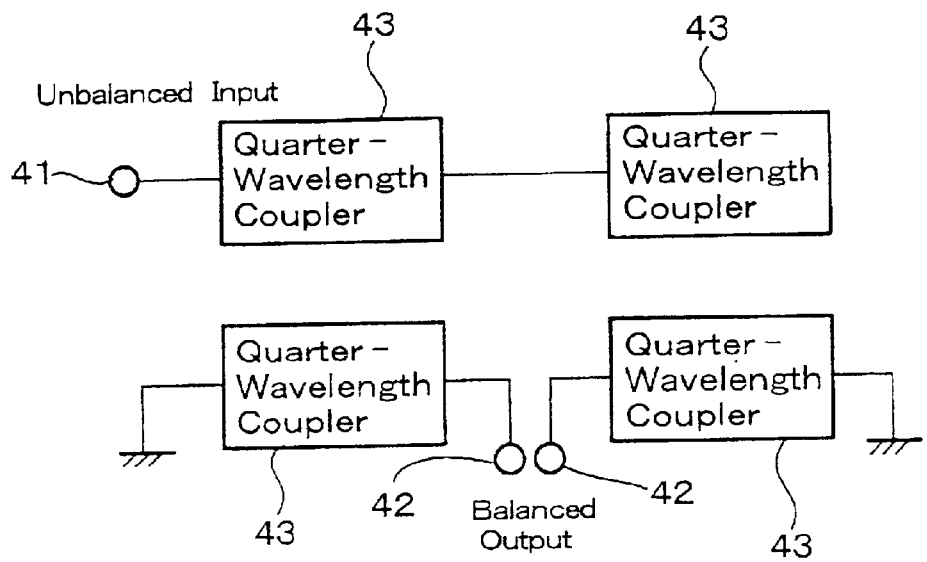
FIG. 1 is an explanatory diagram of an unbalanced-to-balanced converter.
Figure 2:
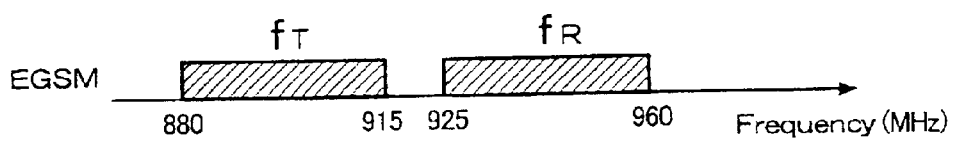
FIG. 2 is a diagram showing frequency layouts of European EGSM and DCS.
Figure 2:
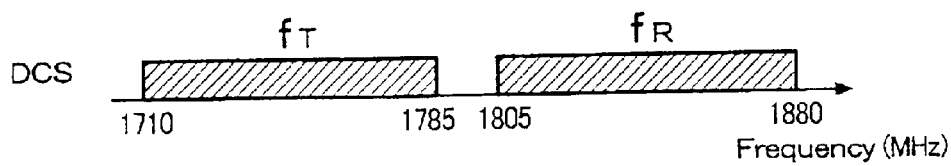

The present invention will be described below with reference to its specific embodiments. FIG. 2 shows examples of frequency bands of GSM (Global System for Mobile Communications) based cellular phone systems adopted in not less than 50% of the world mainly composed of Europe, that is, EGSM (Extended GSM) and DCS (Digital Communications System). In the examples of FIG. 2, the transmission frequency ($f_T$) is 880–915 MHz and the reception frequency ($f_R$) is 925–960 MHz in EGSM. On the other hand, the transmission frequency ($f_T$) is 1,710–1,785 MHz and the reception frequency ($f_R$) is 1,805–1,880 MHz in DCS. Of recent terminals, dual band terminals each supporting both the frequencies of EGSM and DCS by a single terminal have appeared on the scene. Embodiments of the present invention which will be described later show examples of dual band terminals supporting both the frequencies of EGSM and DCS.

Figure 3:
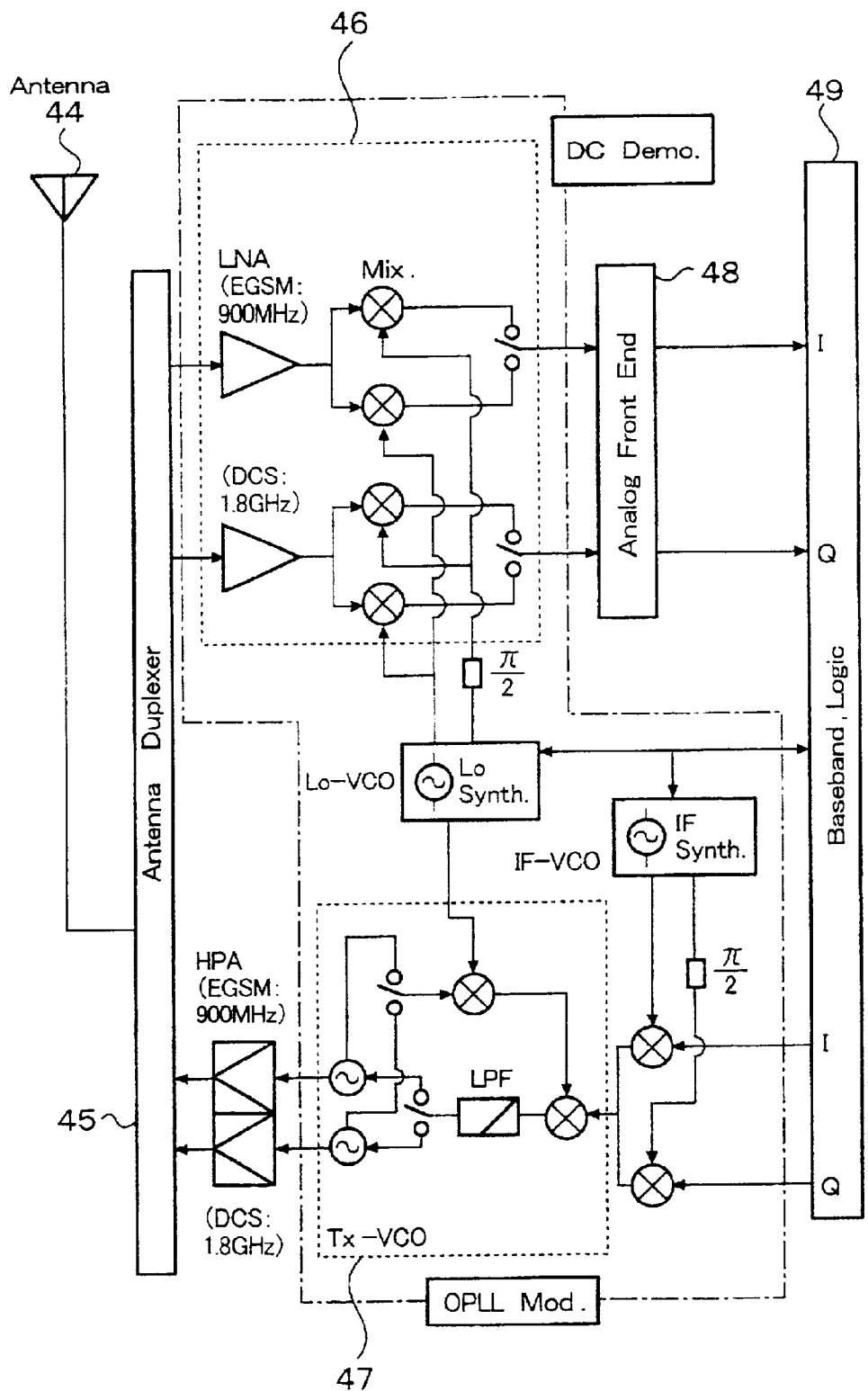
FIG. 3 is a block diagram of a dual band terminal.

FIG. 3 shows an example of a simplified block diagram of a dual band terminal. In FIG. 3, the reference numeral 44 represents an antenna; 45, an antenna duplexer; 46, a receiving circuit; 47, a transmitting circuit; 48, an analog front end having a conversion function for converting an analog signal into a digital signal; and 49, a base-band-system signal processing portion having a data memory, a controller and so on. These members have in the connection relationship as shown in FIG. 3.

To deal with RF signals of the 900 MHz band and the 1.8 GHz band, circuits generally become complicated and large in scale. Various novel circuit systems for miniaturizing terminals have been proposed. According to an OPLL (Offset Phase Lock Loop) modulation system adopted in a transmission system, direct modulation is applied to a VCO (Voltage Controlled Oscillator) by the output of a PLL circuit. As a result, the circuitry of the transmission system can be simplified on a large scale.

On the other hand, as for a reception system, a DC (Direct Conversion) demodulation system using no conventional IF or a low IF (Intermediate Frequency) demodulation system are coming under review. FIG. 3 shows a block diagram of the case where the OPLL modulation system is adopted in the transmission system while the DC modulation system is adopted in the reception system.

Generally, if a radio frequency IC adopting such a mod/demod system is built in one chip, the scale of the chip will be sizable. In addition, because both of signals in the 900 MHz band and the 1.8 GHz band are dealt with in the chip, it is necessary to suppress crosstalk between signal lines and, particularly noise (common mode noise) from the ground of the chip in the reception system as well as possible. For the latter, it has been proved that the influence of common mode noise can be made very low by forming all the signals into differential signals in reception-system circuits. It has to be therefore considered that all the circuits in the reception system in the block diagram shown in FIG. 3 are formed to be differential.

The antenna duplexer 45 in FIG. 3 separates a transmission signal and a reception signal from each other, and sends the transmission signal from the transmitting circuit 47 to the antenna 44 while sending the weak reception signal from the antenna 44 to the receiving circuit 46. Thus, transmission and reception can be achieved by the single antenna 44. Further, in the dual band antenna duplexer, a signal of the 900 MHz band and a signal of the 1.8 GHz band are also separated from each other. Generally, antenna duplexers are arranged by use of filters with a combination of dielectric resonators. However, when ladder-type resonator filters are used, the antenna duplexer can be miniaturized drastically.

However, such filters are of a single end type in which one signal output is provided for the ground, as will be shown specifically later. Accordingly, each reception-system output terminal of antenna duplexers arranged by use of such filters is also of a single end type so that the output terminal cannot be directly connected to a differential radio frequency IC of the reception system. The present invention makes this direct connection possible.

Figure 4:
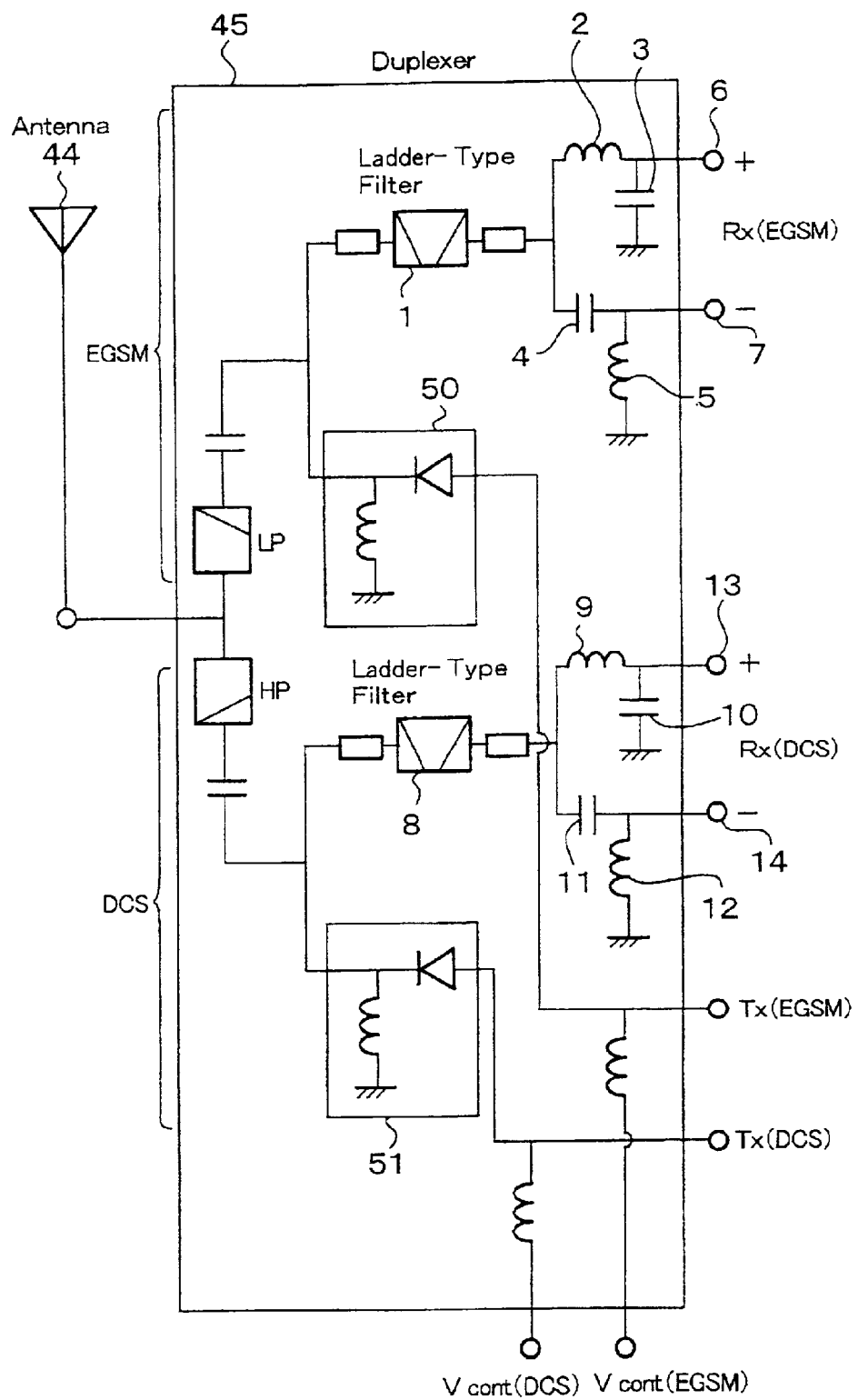
FIG. 4 is a block diagram of a dual band antenna duplexer according to Embodiment 1 of the present invention.

FIG. 4 is a block diagram of a dual band antenna duplexer according to Embodiment 1 of the present invention. As shown in FIG. 4, an antenna duplexer 45 has an EGSM reception system and a DCS reception system. In the EGSM reception system, an output signal from a single end terminal of a ladder-type resonator filter 1 in the antenna duplexer is supplied to a first reception-system output terminal 6 through a serial inductance 2 and a parallel capacitance 3 with respect to the ground. In addition, the output signal is supplied to a second reception-system output terminal 7 through a serial capacitance 4 and a parallel inductance 5 with respect to the ground.

When the ladder-type resonator filter 1 is viewed from the first and second reception-system output terminals 6 and 7, the form of the circuit between the filter 1 and the terminal 6 is the same as and opposite to that between the filter 1 and the terminal 7. Accordingly, the signal of the first reception-system output terminal 6 is delayed in phase relatively to the output terminal signal of the ladder-type resonator filter 1 while the signal of the second reception-system output terminal 7 is advanced in phase. The same relationship described above is applied to the DCS reception system. The reference numeral 8 represents a ladder-type resonator filter; 9, a serial inductance; 10, a parallel capacitance; 11, a serial capacitance; 12, a parallel inductance; 13, a first reception-system output terminal; and 14, a second reception-system output terminal.

As shown in FIG. 4, one end of each of the parallel capacitances 3 and 10 and the parallel inductances 5 and 12 is grounded. Incidentally, the reference numeral 50 in FIG. 4 represents an EGSM transmission-system switch; and 51, a DCS transmission-system switch.

The phase difference between the signals of the first and second reception-system output terminals 6 and 7 is determined from the necessity with which a differential LNA or a differential Mix. connected in a subsequent stage should operate normally. Generally, if the phase difference is not smaller than 90° and not larger than 270°, the differential LNA or the differential Mix. functions as a differential circuit element fundamentally. As a result of examination and numerical calculation about the circuitry, it has been proved that the phase difference between the signals of the first and second reception-system output terminals 6 and 7 can be always fit to an appropriate value not smaller than 90° and not larger than 270° by use of the aforementioned circuitry.

Figure 5:
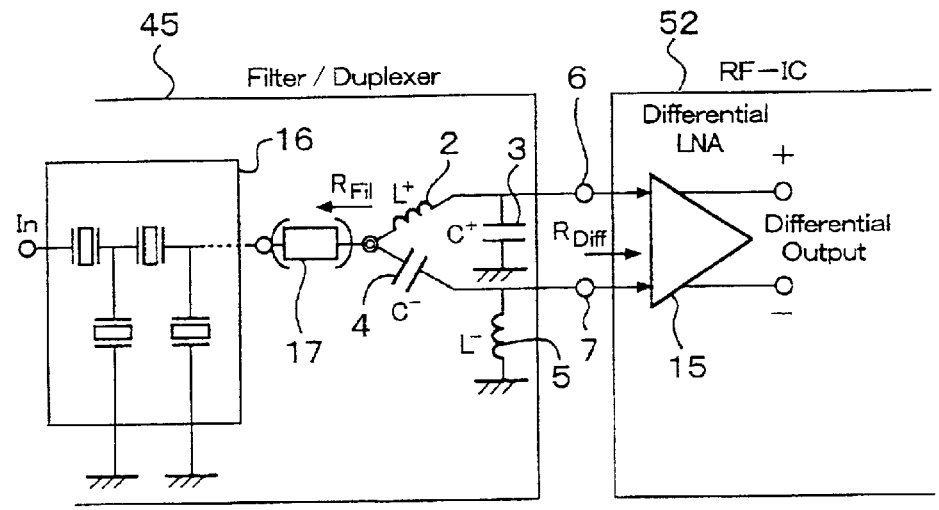
FIG. 5 is a circuit diagram showing the state where reception-system output terminals of the antenna duplexer according to the present invention are connected directly to a radio frequency IC having a differential LNA.
Figure 6:
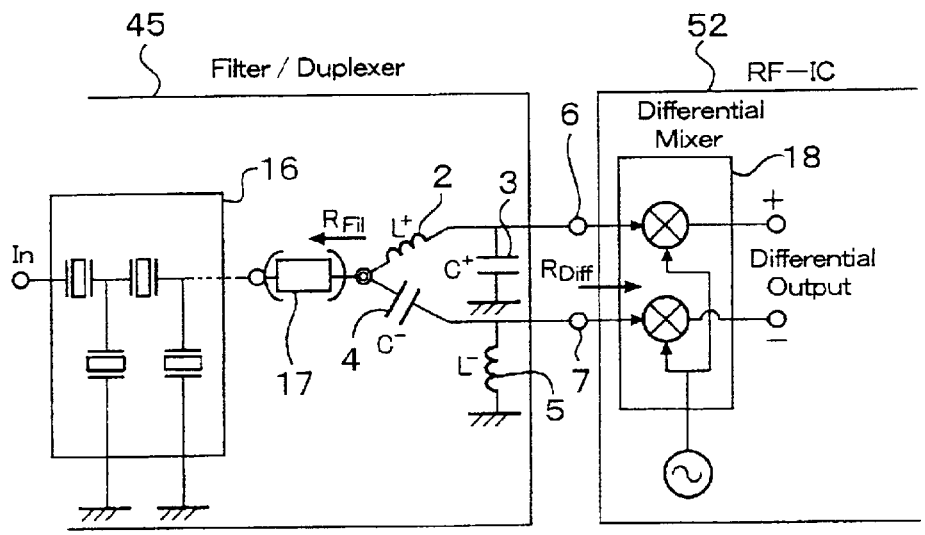
FIG. 6 is a circuit diagram showing the state where reception-system output terminals of the antenna duplexer according to the present invention are connected directly to a radio frequency IC having a differential Mix.

Thus, according to this configuration, as shown in FIGS. 5 and 6, the reception-system output terminals 6 and 7 of the antenna duplexer 45 can be connected directly to a radio frequency IC (RF-IC) 52 having a differential LNA 15 or a differential Mix. 18. As a result, unnecessary peripheral circuits can be omitted on a large scale.

Further, a circuit 17 immediately after the ladder-type resonator filter 16 shown in FIGS. 5 and 6 designates a matching circuit for the ladder-type resonator filter 16. The matching circuit 17 may be introduced if necessary.

Generally, an SAW filter often has capacitive input/output impedance due to the capacitance among electrode fingers of interdigital transducer (hereinafter referred to as "IDT") constituting the filter. On the other hand, an FBAR filter often has capacitive input/output impedance due to the electrostatic capacitance between opposed electrodes. The matching circuit 17 cancels such capacitance. Generally, the matching circuit 17 is often constituted by inductance. This inductance, a serial inductance $L^+$ 2 and a parallel inductance $L^-$ 5 in FIGS. 5 and 6 are formed in the module of the antenna duplexer and in the same process so that the module can be also miniaturized. Further, in the ladder-type resonator filter 16, SAW resonators or FBARs (resonators) are formed in a chip as shown in FIG. 5 or 6 so as to be connected in a ladder circuit configuration.

Ladder-type SAW resonator filter is described in M. Hikita, N. Shibagaki, K. Sakiyama and K. Hasegawa, "Design methodology and experimental results for new ladder-type SAW resonator coupled filter", IEEE Trans. Ultrason. Ferroelec. Freq. Contr., vol. UFFC-42, pp.495–508, 1995.

Ladder-type FBAR filter is described in J. D. Larson III, SM. R. Ruby, P. Bradley, Y. Oshmyanaky, "A BAW antenna duplexer for the 1900 MHz PCS band", in Proc. IEEE Ultrason. Symp. pp.887–890, 1999.

In the case of this embodiment, as shown in FIGS. 5 and 6, a radio frequency filter is constituted by the ladder-type resonator filter 16, the matching circuit 17, the serial inductance 2, the parallel capacitance 3, the serial capacitance 4 and the parallel inductance 5. At least the reception system of the antenna duplexer 45 is provided with this radio frequency filter.

As described above, according to the configuration of FIG. 4, the antenna duplexer 45 can be connected directly to the direct conversion demodulation system or low intermediate frequency demodulation system integrated circuit RF-IC 52 provided with the differential LNA 15 or the differential Mix. 18 as shown in FIG. 5 or 6. Thus, a dead space is cut out. Further, when the matching circuit 17 for the ladder-type resonator filter 16 is formed in the same process as the serial inductance 2 or the parallel inductance 5, the antenna duplexer module can be miniaturized.

Figure 7:
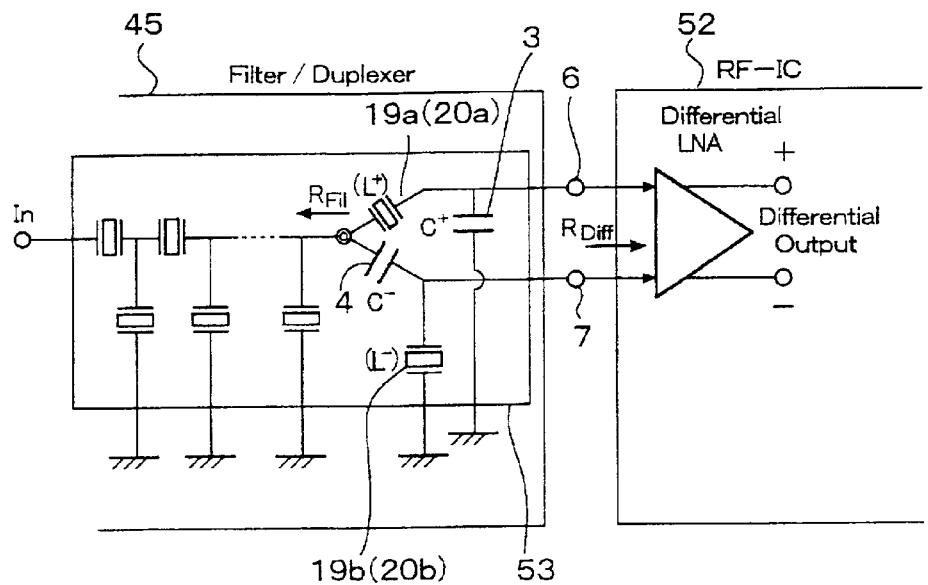
FIG. 7 is a circuit diagram showing the state where reception-system output terminals of an antenna duplexer according to Embodiment 2 of the present invention are connected directly to a radio frequency IC having a differential LNA.
Figure 8:
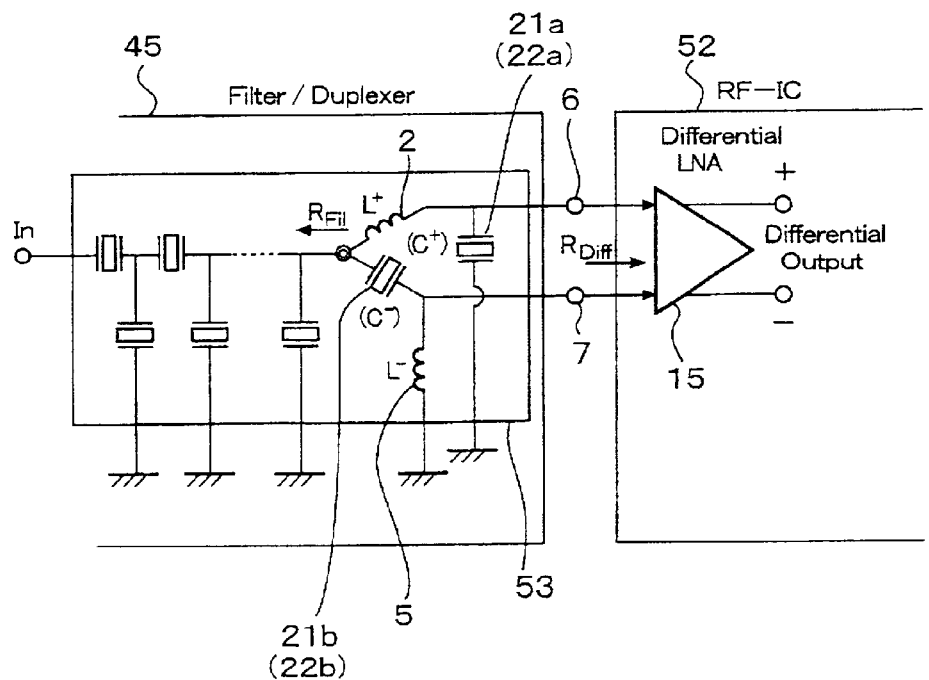
FIG. 8 is a circuit diagram showing the state where reception-system output terminals of an antenna duplexer according to Embodiment 3 of the present invention are connected directly to a radio frequency IC having a differential LNA.
Figure 9:
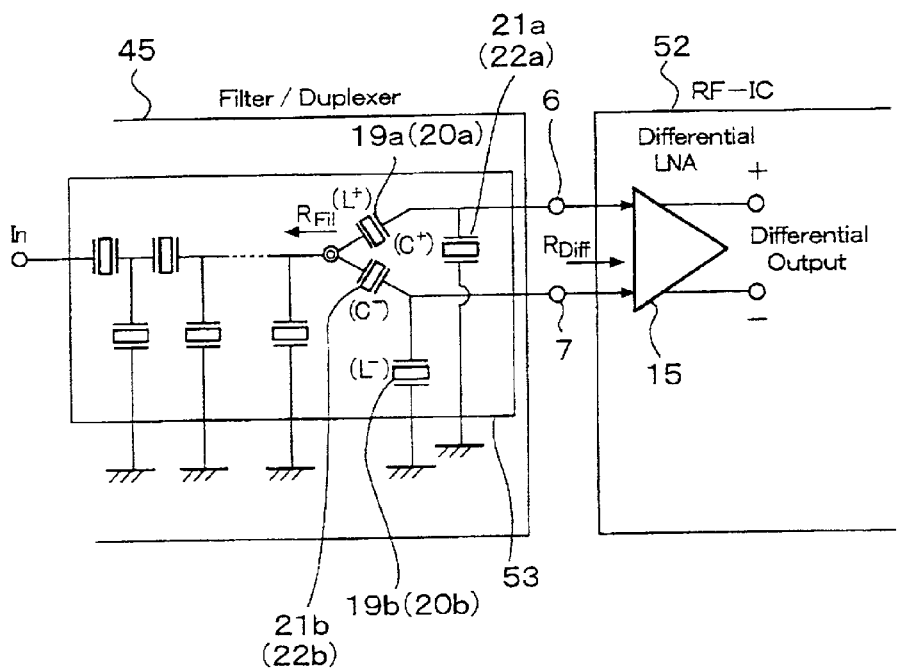
FIG. 9 is a circuit diagram showing the state where reception-system output terminals of an antenna duplexer according to Embodiment 4 of the present invention are connected directly to a radio frequency IC having a differential LNA.

Other embodiments of the present invention are shown in FIGS. 7, 8, and 9. FIG. 7 shows Embodiment 2. In this embodiment, the serial inductance 2 and/or the parallel inductance 5 in Embodiment 1 shown in FIG. 4 are replaced by SAW resonators 19a and/or 19b or FBARs 20a and/or 20b. These SAW resonators or FBARs have impedance as inductance equivalently in the pass band frequency $f_0$ of the reception-system ladder-type resonator filter. Further, the resonators are formed in the same chip as the ladder-type resonator filter.

In the case of Embodiment 2 shown in FIG. 7, a radio frequency filter is constituted by the ladder-type resonator filter 16, the matching circuit 17, the SAW resonator 19a or the FBAR 20a, the parallel capacitance 3, the serial capacitance 4, and the SAW resonator 19b or the FBAR 20b.

Next, Embodiment 3 will be described. In the embodiment of FIG. 8, the serial capacitance 4 and/or the parallel capacitance 3 in Embodiment 1 shown in FIG. 4 are replaced by SAW resonators 21a and/or 21b or FBARs 22a and/or 22b. These resonators have impedance as capacitance equivalently in the pass band frequency $f_0$ of the filter. Further, the resonators are formed in the same chip as the ladder-type resonator filter 16.

In the case of Embodiment 3 shown in FIG. 8, a radio frequency filter is constituted by the ladder-type resonator filter 16, the matching circuit 17, the serial inductance 2, the SAW resonator 21a or the FBAR 22a, the SAW resonator 21b or the FBAR 22b, and the parallel inductance 5.

Next, Embodiment 4 is shown in FIG. 9. In this embodiment, the serial inductance 2 and the parallel inductance 5 in Embodiment 1 shown in FIG. 4 are replaced by SAW resonators 19a and 19b or FBARs 20a and 20b operating as inductance equivalently in the pass band frequency $f_0$. In addition, the serial capacitance 4 and the parallel capacitance 3 are replaced by SAW resonators 21a and 21b or FBARs 22a and 22b operating as capacitance equivalently in the pass band frequency $f_0$. These resonators are formed in the same chip as the ladder-type resonator filter 16.

In the case of Embodiment 4 shown in FIG. 9, a radio frequency filter is constituted by the ladder-type resonator filter 16, the matching circuit 17, the SAW resonator 19a or the FRAR 20a, the SAW resonator 21a or the FBAR 22a, the SAW resonator 21b or the FBAR 22b, and the SAW resonator 19b or the FBAR 20b.

Figure 10:
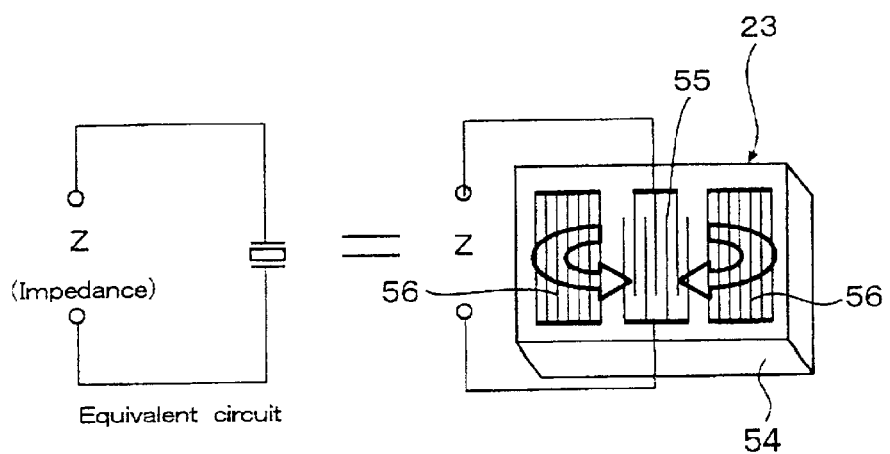
FIG. 10 is a diagram showing an SAW resonator and its equivalent circuit.
Figure 11:
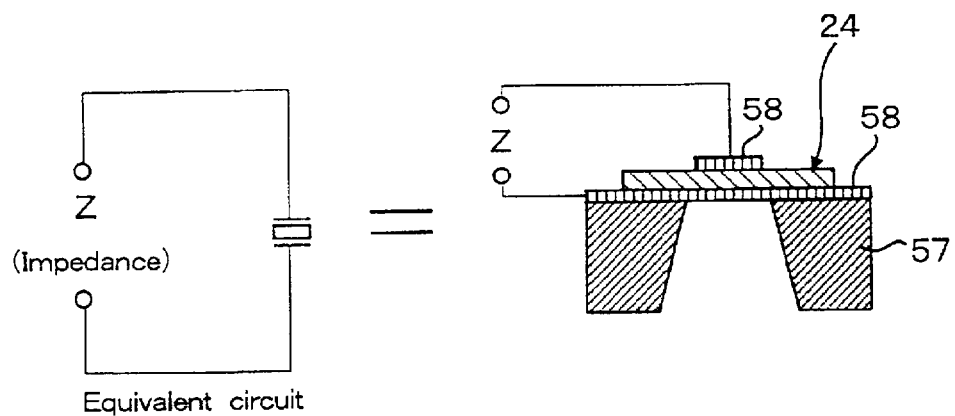
FIG. 11 is a diagram showing an FBAR and its equivalent circuit.

Next, description will be made on the fact that the SAW resonators operate as either inductance or capacitance. FIG. 10 shows an SAW resonator 23, and FIG. 11 shows an FBAR 24 by way of example. In FIG. 10, reflectors 56 are provided on the opposite sides of an IDT 55 made up on a piezoelectric substrate 54 so as to form an SAW resonator. In FIG. 11, a diaphragm-like piezoelectric thin film resonator is provided on the upper portion of a silicon substrate 57 or the like which has been cavitated in an oscillation portion by back etching or the like. Thus, the FBAR 24 is formed on the upper portion of the silicon substrate 57. The reference numeral 58 represents an electrode. Incidentally, the equivalent circuits of the SAW resonator 23 and the FBAR 24 are shown on the left sides of FIGS. 10 and 11 respectively.

Figure 12:
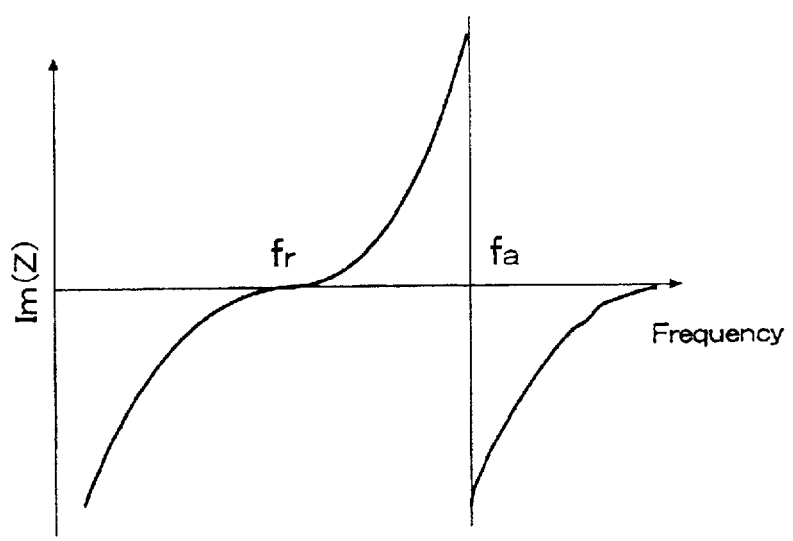
FIG. 12 is a graph showing the impedance characteristic of the SAW resonator and the FBAR.

The impedance Z of these resonators is expressed by $Im(Z) \approx 0$ in a resonance frequency $f_r$ and $Im(Z) \approx \infty$ in an antiresonance frequency $f_a$. As is understood from FIG. 12, the impedance Z becomes capacitive in a frequency lower than $f_r$ and inductive between $f_r$ and $f_a$. The impedance Z becomes capacitive again in a frequency higher than $f_a$. The setting of the frequencies $f_r$ and $f_a$ depends chiefly on the repetition pitch of electrode fingers in the SAW resonator and on the thickness of the piezoelectric thin film in the FBAR. Accordingly, as shown in FIGS. 7 to 9, SAW resonators or FBARs operating as inductance or capacitance equivalently in the pass band frequency $f_0$ of the filter can be always formed.

Figure 13:
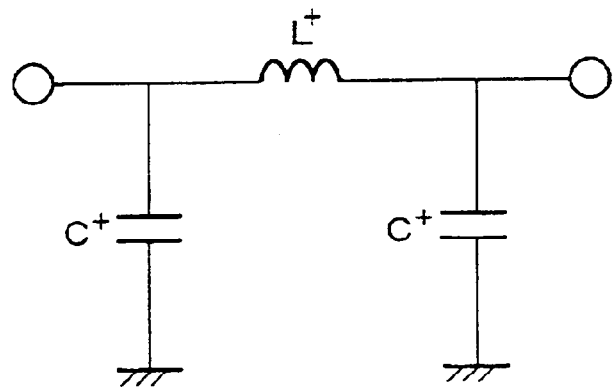
FIG. 13 is a diagram of a π equivalent circuit.
Figure 14:
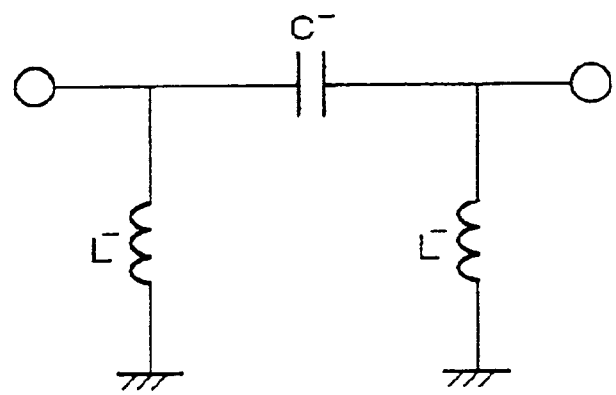
FIG. 14 is a diagram of a π equivalent circuit.

Next, consideration will be made about the values of $L^+$, $C^+$, $L^-$ and $C^-$ in FIGS. 5 to 9. Generally, a circuit advancing the phase and a circuit delaying the phase can be expressed by $\pi$ circuits of FIGS. 13 and 14 respectively. For example, assume that the resistance in view of the ladder-type resonator filter 16 side is $R_{Fil}$ and the resistance in view of the differential LNA 15 side is $R_{Diff}$ as shown in FIG. 5. Assume that the $\pi$ circuit of FIG. 13 is a circuit that impedance-converts $2R_{Fil}$ into $R_{Diff}/2$ at $f_0$, and delays the phase by 90°. On the other hand, assume that the $\pi$ circuit of FIG. 14 is a circuit that impedance-converts $2R_{Fil}$ into $R_{Diff}/2$ at $f_0$, and advances the phase by 90°. In such conditions, $L^+$, $C^+$, $L^-$ and $C^-$ are not determined uniquely. However, when the conditions for producing parallel resonance at $f_0$ are further added in the case where $C^+$ in FIG. 13 and $L^-$ in FIG. 14 are connected in parallel, the parameters of $L^+$, $C^+$, $L^-$ and $C^-$ are determined uniquely as follows. Incidentally, $\omega_0$ in the following expressions designates an angular frquency.

$$L^+=L^-=(R_{Fil}\cdot R_{Diff})^{1/2}/\omega_0$$

$$C^+=C^-=(R_{Fil}\cdot R_{Diff})^{-1/2}/\omega_0$$

The $\pi$ circuits of FIGS. 13 and 14 are connected in parallel with the output of the ladder-type resonator filter 16 of FIG. 5 so as to form a first output terminal 6 and a second output terminal 7. At the frequency $f_0$, the two-fold of the output resistance $R_{Fil}$ of the ladder-type resonator filter 16, that is, $2R_{Fil}$ is impedance-converted into $R_{Diff}/2$ by the respective $\pi$ circuits. Further, outputs whose phases are reverse to each other can be obtained in the first output terminal 6 and the second output terminal 7. Accordingly, when these outputs are extracted as a differential output, the output resistance becomes $R_{Diff}$. On the other hand, when two $R_{Fil}$ are connected in parallel on the input side, the input resistance becomes $R_{Fil}$. That is, the output resistance $R_{Fil}$ of the ladder-type resonance filter 16 can be perfectly matched to the input resistance $R_{Diff}$ of the differential LNA 15.

Further, $C^+$ and $L^-$ in FIGS. 13 and 14 provide parallel resonance at the frequency $f_0$. Since the impedance of the parallel circuit portion of $C^+$ and $L^-$ is substantially in a frequency near $f_0$, it has been confirmed that substantial influence is extremely small even if this parallel circuit portion is removed. That is, FIG. 5 shows the case where the parallel circuit portion of $C^+$ and $L^-$ has been removed.

Further, when the differential LNA 15 and the antenna duplexer 45 are connected directly as shown in FIG. 5, in order to guarantee sufficient performance in consideration of the variation of the radio frequency IC 52, the amplitude deviation between the output of the first output terminal 6 and the output of the second output terminal 7 has to be made not higher than ±1 dB, and the phase deviation has to be made not higher than ±10° with respect to 180°. It was found that when these deviations were allocated to the respective values of the above-mentioned $L^+$, $C^+$, $L^-$ and $C^-$, each of the values has to be suppressed within a variation range of ±20%.

On the other hand, from the point of view on the circuit design, when the above-mentioned $R_{Fil}$ and $R_{Diff}$ satisfy the relationship $2R_{Fil}=R_{Diff}/2$, the input and output resistances of each of the $\pi$ circuits of FIGS. 13 and 14 coincide with each other. In this case, the most accurate circuit design can be made. Accordingly, in this case, the circuit design is provided by the relational expressions $L^+ \approx L^- \approx R_{Diff}/2\omega_0$ and $C^+ \approx C^- \approx 2/(R_{Diff} \cdot \omega_0)$. Further, in a radio frequency of a GHz band, all of measuring instruments are based on 50Ω systems. When $2R_{Fil}=R_{Diff}/2=50\Omega$ is set in the above-mentioned relational expressions, a very accurate antenna duplexer can be formed in the evaluation system as well as in the circuit design. Thus, most of problems caused by the direct connection with the differential LNA 15 or the differential Mix. 18 are solved.

Although the above discussion was made with reference to FIG. 5, the same thing is also applied to FIGS. 6 to 9. Further, although an antenna duplexer was described in detail by way of example, the same relationship is established in a ladder-type SAW resonator filter alone or a ladder-type FBAR filter alone.

Figure 15:
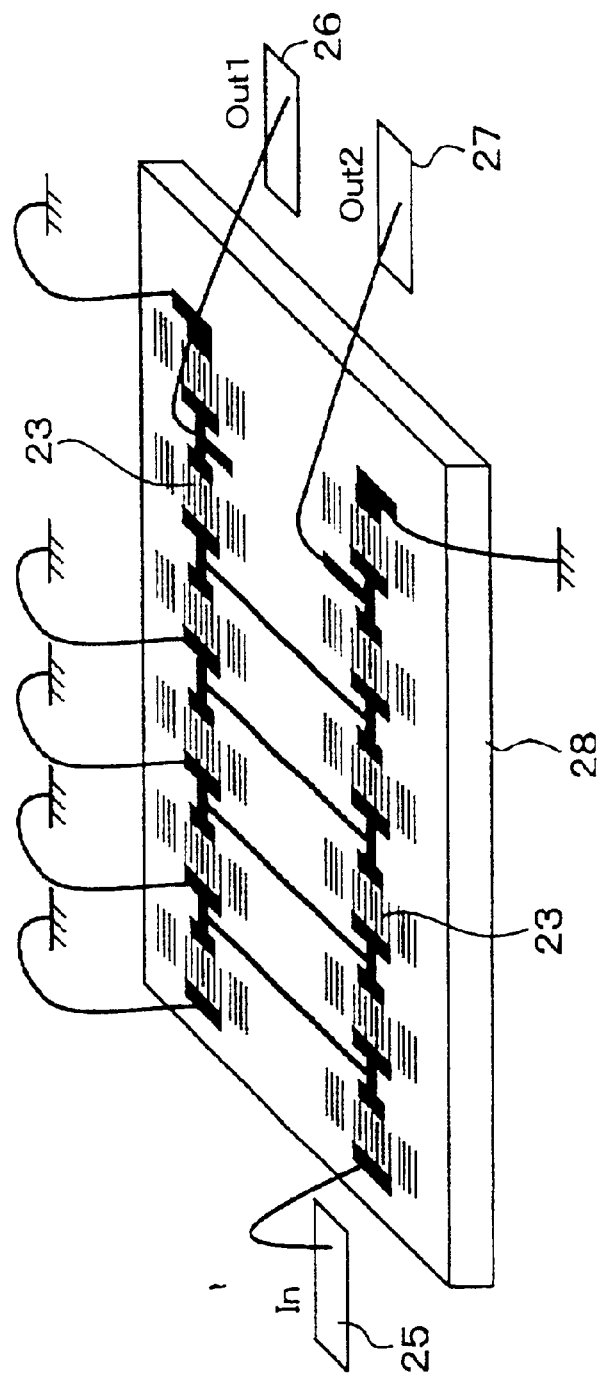
FIG. 15 is a view showing the chip configuration of a ladder-type SAW resonator filter according to the present invention.
Figure 16A:
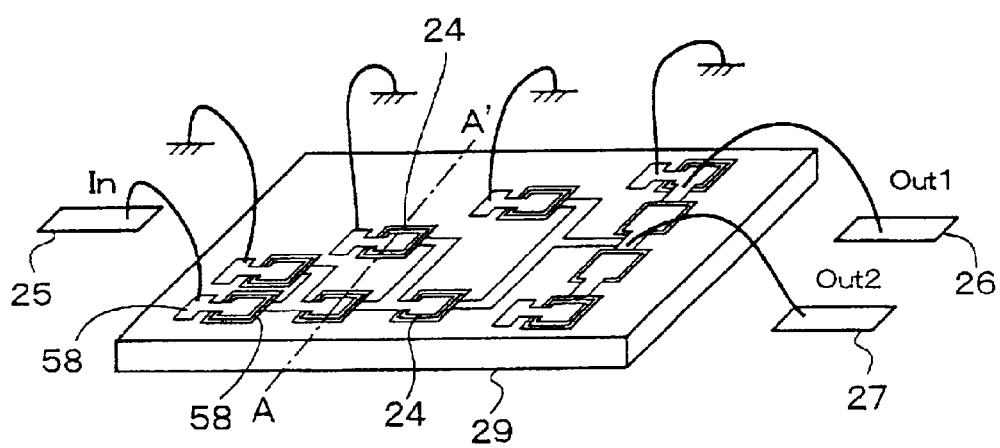
FIGS. 16A and 16B are views showing the chip configuration of a ladder-type FBAR filter according to the present invention.
Figure 16B:
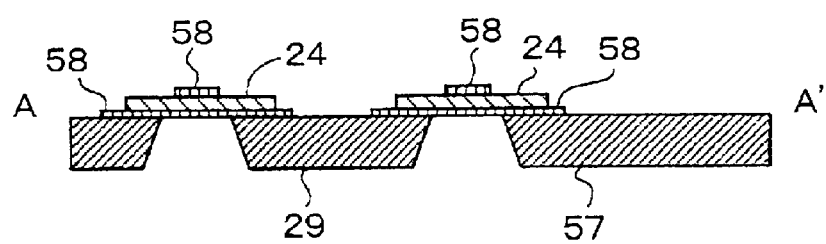

Next, Embodiment 5 will be described. FIG. 15 and FIGS. 16A and 16B show specific examples of chip configurations. By use of the configuration of FIG. 9 by way of example, FIG. 15 shows a case where a ladder-type SAW resonator filter is used, and FIGS. 16A and 16B show a case where a ladder-type FBAR filter is used. FIG. 16B is a sectional view taken on line A–A' of FIG. 16A. Incidentally, the portions having direct relations to an SAW filter chip 28 and an FBAR filter chip 29 are enlarged for illustration.

The reference numeral 25 in the drawings represents an input terminal of the SAW filter chip 28 or the FBAR filter chip 29; 26 and 27 represent first and second output terminals thereof for connecting with the differential LNA 15 or the differential Mix. 18. These examples show the case where all of equivalent $L^+$, $C^+$, $L^-$, and $C^-$ are formed out of SAW resonators or FBARs on the SAW filter chip 28 or the FBAR filter chip 29. However, as shown in FIGS. 7 and 8, a part of those members may be formed on the chip in the same manner.

Figure 17:
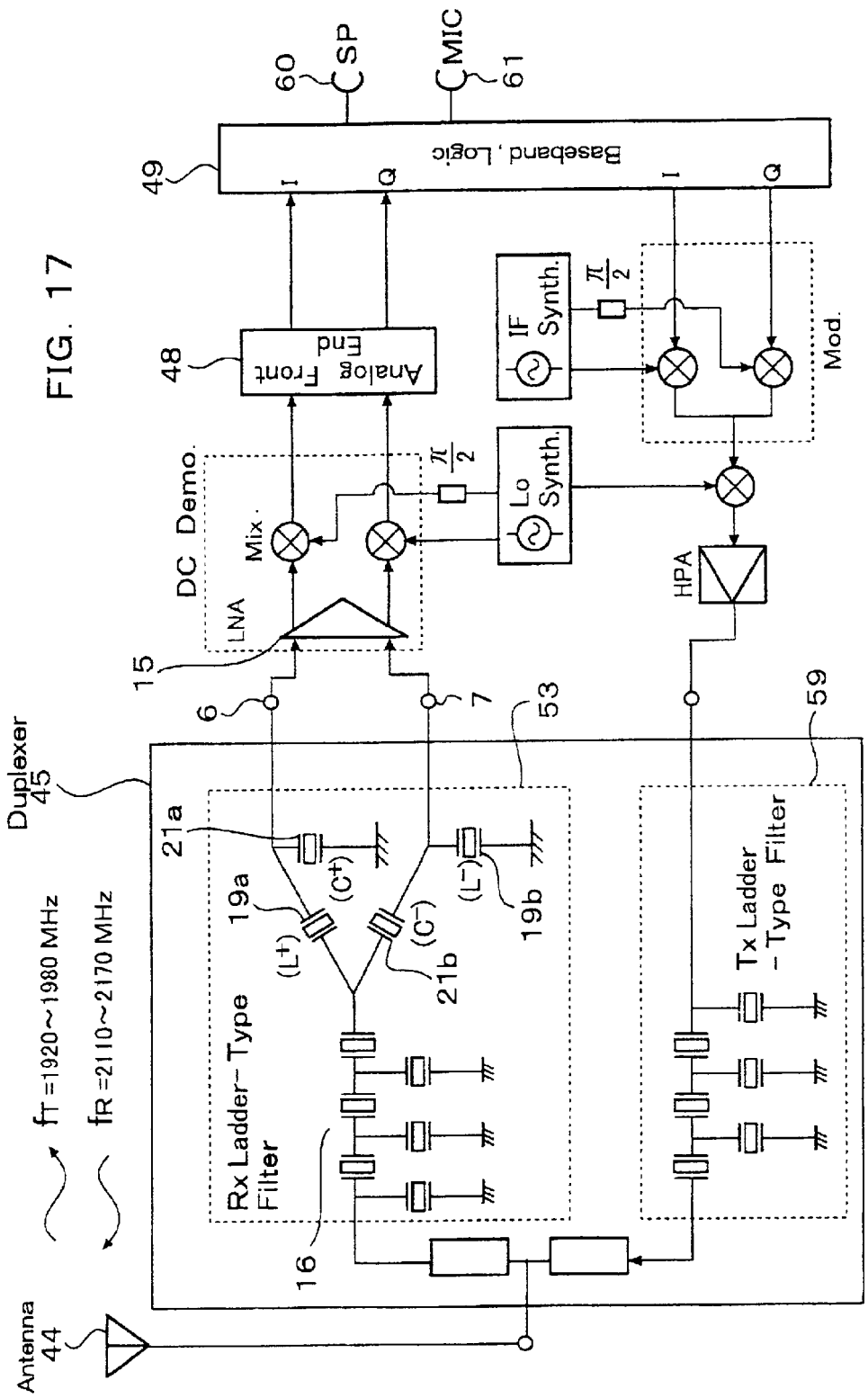
FIG. 17 is a block diagram of an example of a WCDMA antenna duplexer according to the present invention and a WCDMA terminal.

FIG. 17 shows Embodiment 6. FIG. 17 shows a case of a WCDMA (wideband CDMA) terminal using the 2 GHz band with which service will be begun in the near future. In the WCDMA, the transmission frequency ($f_T$) is 1,920–1,980 MHz and the reception frequency ($f_R$) is 2,110–2,170 MHz. In addition, in order to make two-way simultaneous communication, both the transmission system and the reception system of the antenna duplexer are constituted by use of filters without using any switch. FIG. 17 shows an example in which not only the reception-system filter but also the transmission-system filter are constituted by ladder-type resonator filters.

In order to connect the differential LNA 15 directly to the antenna duplexer 45, the output terminal of the reception-system ladder-type resonator filter is made to branch into two by use of SAW resonators 19a and 19b (or FBARs 20a and 20b) which are serial resonators and SAW resonators 21a and 21b (or FBAR 22a and 22b) which are parallel resonators. The two branches are formed as a first reception-system output terminal 6 and a second reception-system output terminal 7 respectively.

These terminals 6 and 7 are connected directly to differential input terminals of the differential LNA 15. Although description was made on the case in which the SAW resonators 19a and 19b (or FBARs 20a and 20b) as serial resonators and SAW resonators 21a and 21b (or FBAR 22a and 22b) as parallel resonators were formed in the chip of the ladder-type resonator filter, those resonators may be formed outside the chip as shown in FIG. 5, or both the methods may be combined as shown in FIGS. 7 and 8.

The reference numeral 53 in FIG. 17 represents a reception-system radio frequency filter; 59, a transmission-system radio frequency filter; 60 and 61, a speaker and a microphone connected to a baseband-system signal processing portion 49.

Although the description in the above-mentioned embodiments was made on the case where the radio frequency filter (radio frequency circuit) was used for a mobile radio terminal, the radio frequency filter (radio frequency circuit) according to the present invention is applicable to other terminals such as a fixed radio terminal, a satellite communication terminal, an optical communication terminal, and the like.

As described above in the embodiments, according to the present invention, it is possible to connect an antenna duplexer directly to a differential LNA or a differential Mix. in a direct conversion demodulation system, a low intermediate frequency demodulation system, and so on, that will be most likely to be introduced into terminals supporting dual bands or supporting CDMA which is a new system, such as recent cellular phones or the like. According to the configuration of the present invention, a dead space can be cut out on a large scale. In addition, great improvement can be made also in the characteristic of design, the easiness of evaluation, and the like.

What is claimed is:

1. A radio frequency filter comprising:
   a ladder-type resonator filter in which a plurality of first surface acoustic wave resonators or first film bulk acoustic resonators are connected in a ladder circuit configuration;
   a first terminal and a second terminal;
   a serial inductance and a parallel capacitance connected between said ladder-type resonator filter and said first terminal; and
   a serial capacitance and a parallel inductance connected between said ladder-type resonator filter and said second terminal;
   wherein one end of each of said parallel capacitance and said parallel inductance is grounded;
   wherein a phase difference between a signal of said first terminal and a signal of said second terminal is regulated to be not lower than 90 degrees and not higher than 270 degrees.

2. A radio frequency circuit using a radio frequency filter at least in a receiving circuit, wherein said radio frequency filter is a radio frequency filter according to claim 1.

3. An antenna duplexer in which a radio frequency filter is used at least in a receiving circuit, and in which a transmission signal from a transmitting circuit and a reception signal are separated from each other, and said transmission signal is sent to an antenna while said reception signal from said antenna is sent to said receiving circuit, so that transmission and reception can be achieved with said single antenna, wherein said radio frequency filter is a radio frequency filter according to claim 1.

4. A radio terminal comprising an antenna and an antenna duplexer, wherein said antenna duplexer is an antenna duplexer according to claim 3.

5. A radio terminal according to claim 4, wherein said radio terminal is a mobile radio terminal.

6. A radio frequency filter according to claim 1, wherein at least one of said serial capacitance and said parallel capacitance is a second surface acoustic wave resonator or a second film bulk acoustic resonator having an impedance characteristic as a capacitance equivalently in a pass band frequency $f_0$ of said radio frequency filter, and formed on a chip on which said first surface acoustic wave resonators or said first film bulk acoustic resonators are formed.

7. A radio frequency filter comprising:
   a ladder-type resonator filter in which a plurality of first surface acoustic wave resonators or first film bulk acoustic resonators are connected in a ladder circuit configuration;
   a first terminal and a second terminal;
   a serial inductance and a parallel capacitance connected between said ladder-type resonator filter and said first terminal; and
   a serial capacitance and a parallel inductance connected between said ladder-type resonator filter and said second terminal;
   wherein at least one of said serial inductance and said parallel inductance is a second surface acoustic wave resonator or a second film bulk acoustic resonator having an impedance characteristic as an inductance equivalently in a pass band frequency $f_0$ of said radio frequency filter, and formed on a chip on which said first surface acoustic wave resonators or said first film bulk acoustic resonators are formed.

8. A radio frequency filter comprising:
   a ladder-type resonator filter in which a plurality of first surface acoustic wave resonators or first film bulk acoustic resonators are connected in a ladder circuit configuration;
   a first terminal and a second terminal;
   a serial inductance and a parallel capacitance connected between said ladder-type resonator filter and said first terminal; and
   a serial capacitance and a parallel inductance connected between said ladder-type resonator filter and said second terminal;
   wherein an output signal of said radio frequency filter passing through said radio frequency filter to be thereby formed in a pass band frequency $f_0$ has an amplitude deviation of not higher than ±1 dB and a phase deviation of not higher than ±10° with respect to 180° between said first terminal and said second terminal.

9. A radio frequency filter comprising:
   a ladder-type resonator filter in which a plurality of first surface acoustic wave resonators or first film bulk acoustic resonators are connected in a ladder circuit configuration;
   a first terminal and a second terminal;
   a serial inductance and a parallel capacitance connected between said ladder-type resonator filter and said first terminal; and
   a serial capacitance and a parallel inductance connected between said ladder-type resonator filter and said second terminal;
   wherein said first terminal and said second terminal are connected to differential terminals of a differential amplifier or a differential mixer respectively.

10. An antenna duplexer in which a radio frequency filter is used at least in a receiving circuit, and in which a transmission signal from a transmitting circuit and a reception signal are separated from each other, and said transmission signal is sent to an antenna while said reception signal from said antenna is sent to said receiving circuit, so that transmission and reception can be achieved with said single antenna, wherein said radio frequency filter is a radio frequency filter according to claim 9.

11. A radio terminal comprising an antenna and an antenna duplexer, wherein said antenna duplexer is an antenna duplexer according to claim 10.

12. A radio terminal according to claim 11, wherein said differential amplifier or said differential mixer is a part of a direct conversion type demodulation integrated circuit or a low intermediate frequency type demodulation integrated circuit.

13. A radio terminal according to claim 11, wherein said radio terminal is a mobile radio terminal.

14. A radio frequency filter according to claim 9, wherein at least one of said serial inductance and said parallel inductance is a second surface acoustic wave resonator or a second film bulk acoustic resonator having an impedance characteristic as an inductance equivalently in a pass band frequency $f_0$ of said radio frequency filter, and formed on a chip on which said first surface acoustic wave resonators or said first film bulk acoustic resonators are formed.

15. A radio frequency filter according to claim 14, wherein an output signal of said radio frequency filter passing through said radio frequency filter to be thereby formed in a pass band frequency $f_0$ has an amplitude deviation of not higher than ±1 dB and a phase deviation of not higher than ±10° with respect to 180° between said first terminal and said second terminal.

16. A radio frequency filter according to claim 9, wherein said serial inductance $L^+$ and said parallel inductance $L^-$ are expressed by $(R_{Fil} \cdot R_{Diff})^{1/2}/\omega_0 \pm 20\%$ and said serial capacitance $C^-$ and said parallel capacitance $C^+$ are expressed by $(R_{Fil} \cdot R_{Diff})^{-1/2}/\omega_0 \pm 20\%$ when $R_{Fil}$ designates an output or input resistance of said radio frequency filter in a pass band frequency $f_0$ and an angular frequency $\omega_0 = 2\pi f_0$, and $R_{Diff}$ designates a differential input or differential output resistance of said differential amplifier or said differential mixer in said pass band frequency.

17. A radio frequency filter according to claim 16, wherein said resistance, inductances and capacitances $R_{Fil}$, $L^+$, $L^-$, $C^+$ and $C^-$ are expressed by expressions $2R_{Fil} = R_{Diff}/2 \pm 20\%$, $L^+ = L^- = R_{Diff}/(2\omega_0) \pm 20\%$ and $C^+ = C^- = 2/(R_{Diff} \cdot \omega_0) \pm 20\%$.

18. A radio frequency filter according to claim 17, wherein said expression $2R_{Fil} = R_{Diff}/2$ is expressed by an expression $2R_{Fil} = R_{Diff}/2 = 50\Omega \pm 20\%$.

* * * * *